US011984318B2

(12) United States Patent
Liang et al.

(10) Patent No.: US 11,984,318 B2
(45) Date of Patent: May 14, 2024

(54) DIRECTIONAL MODIFICATION OF PATTERNING STRUCTURE TO ENHANCE PATTERN ELONGATION PROCESS MARGIN

(71) Applicant: Applied Materials, Inc., Santa Clara, CA (US)

(72) Inventors: Shurong Liang, Lynnfield, MA (US); Alexander C. Kontos, Beverly, MA (US); Il-Woong Koo, North Andover, MA (US)

(73) Assignee: Applied Materials, Inc., Santa Clara, CA (US)

(*) Notice: Subject to any disclaimer, the term of this patent is extended or adjusted under 35 U.S.C. 154(b) by 691 days.

(21) Appl. No.: 17/122,323

(22) Filed: Dec. 15, 2020

(65) Prior Publication Data
US 2022/0189772 A1 Jun. 16, 2022

(51) Int. Cl.
*H01L 21/033* (2006.01)
*H01L 21/04* (2006.01)
*H01L 21/308* (2006.01)
*H01L 21/311* (2006.01)
*H01L 21/3213* (2006.01)

(52) U.S. Cl.
CPC ...... *H01L 21/0337* (2013.01); *H01L 21/0332* (2013.01); *H01L 21/0475* (2013.01); *H01L 21/3086* (2013.01); *H01L 21/31116* (2013.01); *H01L 21/32137* (2013.01)

(58) Field of Classification Search
CPC ............ H01L 21/0337; H01L 21/0332; H01L 21/0475; H01L 21/3086; H01L 21/31116; H01L 21/32137; H01L 21/0335

USPC .................................................. 204/192.34
See application file for complete search history.

(56) References Cited

U.S. PATENT DOCUMENTS 8,975,089 B1* 3/2015 Jung ...................... H10N 50/01
257/295
2016/0336509 A1* 11/2016 Jeong ................ H01L 21/02266

FOREIGN PATENT DOCUMENTS

JP 54-155771 * 8/1979

OTHER PUBLICATIONS

Machine Translation JP 54-155771 (Year: 1979).*

* cited by examiner

*Primary Examiner* — Rodney G McDonald
(74) *Attorney, Agent, or Firm* — KDW Firm PLLC

(57) ABSTRACT

A method for patterning structures including providing a layer stack having a plurality of device layers and a hardmask layer disposed in a stacked arrangement, the layer stack having a plurality of trenches formed therein, the trenches extending through the hardmask layer and into at least one of the device layers, the trenches having lateral sidewalls with a first slope relative to a plane perpendicular to upper surfaces of the device layers, and performing a sputter etching process wherein ion beams are directed toward the hardmask layer to etch the hardmask layer and cause etched material from the hardmask layer to be redistributed along the lateral sidewalls of the trenches to provide the lateral sidewalls with a second slope relative to the plane perpendicular to the upper surfaces of the device layers, the second slope less than the first slope.

19 Claims, 4 Drawing Sheets

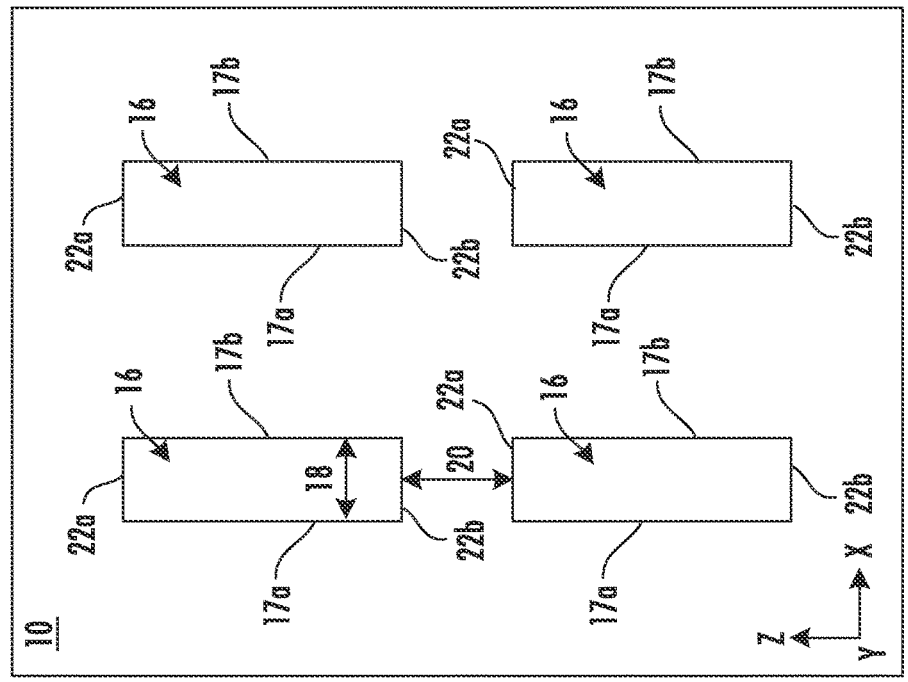
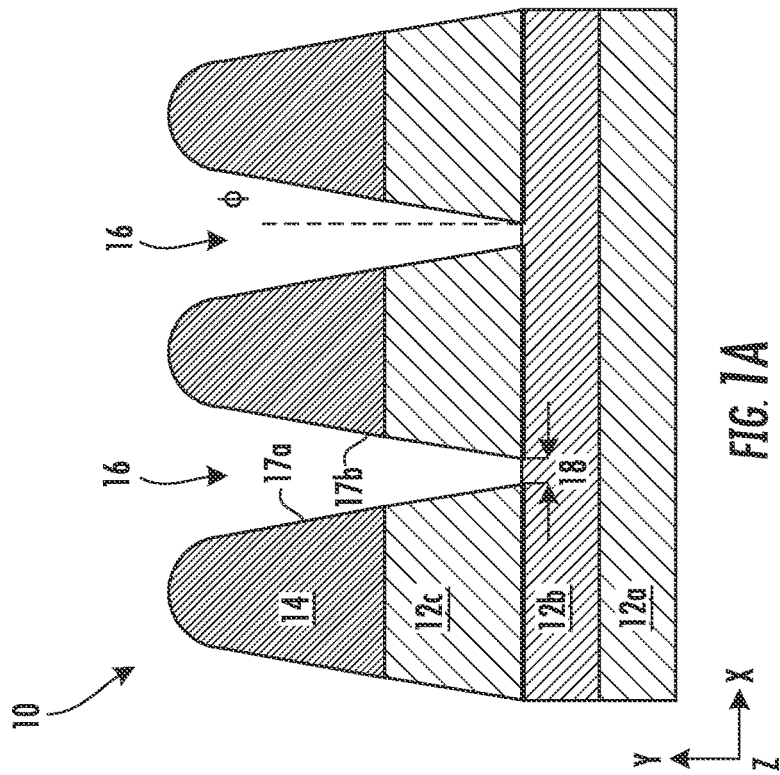

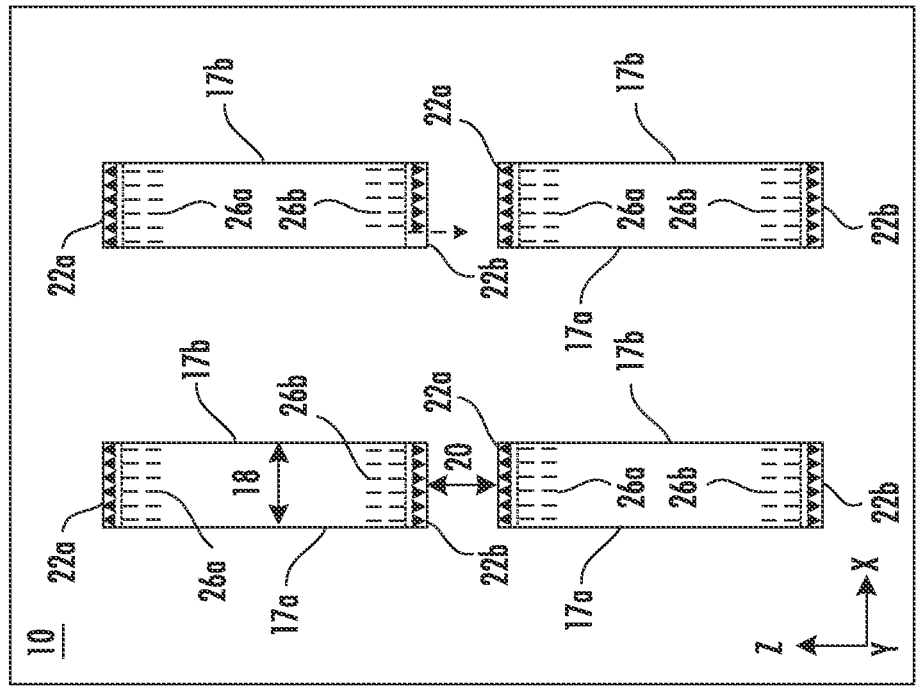
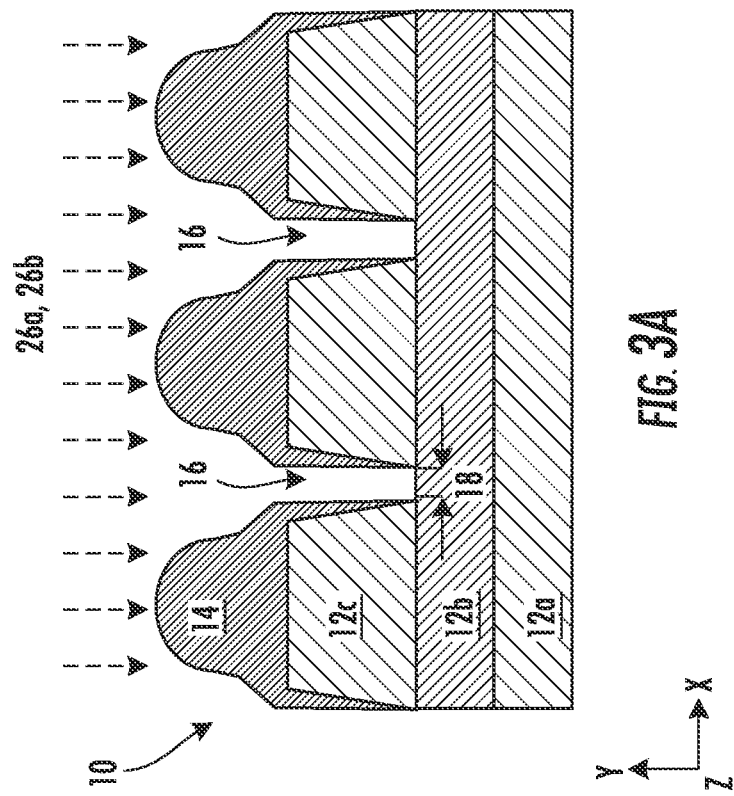
FIG. 3A
FIG. 3B

DIRECTIONAL MODIFICATION OF PATTERNING STRUCTURE TO ENHANCE PATTERN ELONGATION PROCESS MARGIN

FIELD OF THE DISCLOSURE

Embodiments of the present disclosure relate to the field of semiconductor device fabrication, and more particularly to techniques for pattern formation in substrates.

BACKGROUND OF THE DISCLOSURE

As semiconductor devices continue to scale to smaller dimensions, the patterning of surface features in semiconductor substrates employed in such devices becomes increasingly difficult due to the small size and dense packing of such features. For example, in the manufacture of fin field-effect transistor (FinFET) devices, it has become challenging to form nanometer-scale trench features in semiconductor substrates using conventional lithography processes while avoiding so-called "tip-to-tip shorting," wherein adjacent trenches may inadvertently run into one another. Tip-to-tip shorting in FinFET devices may be detrimental to the overall performance of a device and is therefore undesirable.

In order to address the problem of tip-to-tip shorting, pattering techniques have been developed wherein, after forming a series of trenches using conventional lithography processes, angled ion beams are used to etch the longitudinally opposing sidewalls of the trenches. The trenches are thus elongated and the distances between the trenches are reduced in a highly controlled manner without risk of tip-to-tip shorting. In order to fully realize benefits of this elongation technique, the lateral sidewalls of the trenches (i.e., the sidewalls orthogonal to those being etched) are ideally perfectly vertical. Thus, the ion beams used to etch the longitudinal sidewalls are oriented parallel to, and do not collide with or etch, the lateral sidewalls of the trenches. The critical dimensions of the trenches (i.e., the widths of the trenches) are thus preserved during the elongation process. However, due to inconsistencies and variations attendant to conventional trench formation techniques, the lateral sidewalls of trenches are sometimes not perfectly vertical and are instead slightly sloped or angled, resulting in tapered trenches have narrow bottoms and relatively wider tops. Thus, when the above-described elongation technique is performed, the ion beams used to etch the longitudinal sidewalls of the trench may also collide with, and may etch, the angled lateral sidewalls. The trenches are thus widened, and the critical dimensions of the trenches are altered in an undesirable or unpredictable manner. This may be detrimental to the overall performance of a resulting semiconductor device.

Thus, a need exists for efficient, inexpensive processes for patterning device features (e.g., trenches) in semiconductor substrates in a manner facilitating small feature sizes and dense packing while mitigating tip-to-tip shorting and critical dimension variation. With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method for patterning structures in accordance with a non-limiting embodiment of the present disclosure may include providing a layer stack including a plurality of device layers and a hardmask layer disposed in a stacked arrangement, the layer stack having a plurality of trenches formed therein, the trenches extending through the hardmask layer and into at least one of the device layers, the trenches having lateral sidewalls with a first slope relative to a plane perpendicular to upper surfaces of the device layers, and performing a sputter etching process wherein ion beams are directed toward the hardmask layer to etch the hardmask layer and cause etched material from the hardmask layer to be redistributed along the lateral sidewalls of the trenches to provide the lateral sidewalls with a second slope relative to the plane perpendicular to the upper surfaces of the device layers, the second slope less than the first slope.

Another method for patterning structures in accordance with a non-limiting embodiment of the present disclosure may include providing a layer stack including a plurality of device layers and a hardmask layer disposed in a stacked arrangement, the layer stack having a plurality of trenches formed therein, the trenches extending through the hardmask layer and into at least one of the device layers, the trenches having lateral sidewalls with a first slope relative to a plane perpendicular to upper surfaces of the device layers, and performing a sputter etching process wherein ion beams are directed toward the hardmask layer to etch the hardmask layer and cause etched material from the hardmask layer to be redistributed along the lateral sidewalls of the trenches to provide the lateral sidewalls with a second slope relative to the plane perpendicular to the upper surfaces of the device layers, the second slope less than the first slope. The method may further include performing a first ion etching process wherein ion beams are directed to longitudinal sidewalls of the trenches to elongate the trenches and reduce tip-to-tip distances between longitudinally adjacent trenches, and wherein critical dimensions of the trenches are preserved, the critical dimensions being lateral widths of the trenches measured along an upper surface of an uppermost of the device layers, and performing a second ion etching process wherein ion beams are directed to into the trenches at an angle perpendicular to the upper surfaces of the device layers to etch one or more of the device layers and thus extend the trenches into the one or more of the device layers.

BRIEF DESCRIPTION OF THE DRAWINGS

By way of example, various embodiments of the disclosed techniques will now be described with reference to the accompanying drawings, wherein:

FIGS. 1A-4B are a series of cross-sectional views illustrating a method of forming patterns in a hardmask layer and in underlying device layers in accordance with an exemplary embodiment of the present disclosure.

DETAILED DESCRIPTION

Figure 2B:
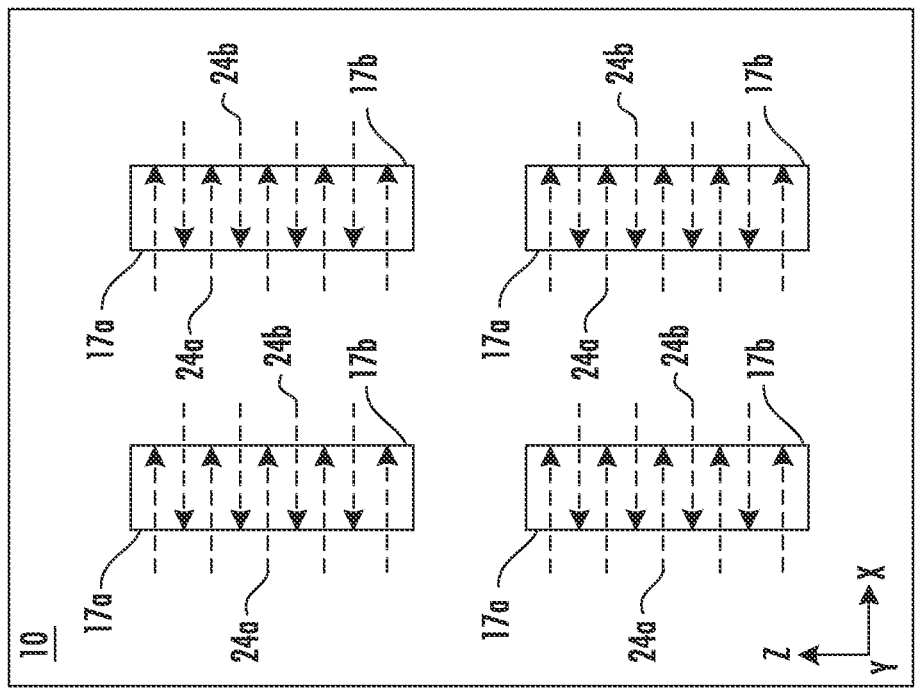

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques for patterning substrates, and in particular novel techniques for forming nanometer-scale (e.g., 2 nanometer to 100 nanometer) surface features in substrates such as hardmasks for facilitating the patterning of such features into underlying device layers (e.g., semiconductor layers). Examples of such surface features include trenches formed within a substrate. As used herein, the term "trench" may refer to a void extending through the entirety of the thickness of a substrate. The term "trench" may also refer to a void such as a depression or recess formed within a substrate and not extending through the entirety of the thickness of the substrate.

Referring to FIGS. 1A-4B, an exemplary process for forming patterns in a hardmask layer and in underlying device layers with nanometer-scale tip-to-tip distances while avoiding tip-to-tip shorting and while mitigating critical dimension variation in the surface features is shown. For the sake of convenience and clarity, terms such as "top," "bottom," "upper," "lower," "lateral," "longitudinal," "vertical," and "horizontal" may be used below to describe the relative placement and orientation of various elements, all with respect to the geometry and orientation of such elements as they are presented in the drawings. Said terminology will include the words specifically mentioned, derivatives thereof, and words of similar import.

Referring to the cross-sectional view shown in FIG. 1A and the corresponding plan view shown in FIG. 1B, a layer stack 10 may be provided and may include a plurality of device layers 12a, 12b, 12c and a hardmask layer 14 disposed in a vertically stacked arrangement in the aforementioned order. One or more of the device layers 12a-12c may be formed of a semiconductor material including, and not limited to, silicon (e.g., crystalline silicon), germanium, silicon carbide, gallium arsenide, gallium nitride, etc. The hardmask layer 14 may be formed of any conventional hardmask material, including, and not limited to, one or more of silicon dioxide, silicon nitride, and amorphous carbon, etc.

The layer stack 10 may have a plurality of trenches 16 formed therein and arranged in a matrix configuration as best shown in FIG. 1B. As shown in FIG. 1A, the trenches 16 may extend vertically through the hardmask layer 14 and through the device layer 12c and may terminate at the upper surface of the device layer 12b. The present disclosure is not limited in this regard. The lateral sidewalls 17a, 17b of the trenches 16 may be angled, sloped, or otherwise non-vertical, such as may result from patterning inconsistencies and/or variations attendant to conventional trench formation techniques. In various, non-limiting examples, one or more of the sidewalls 16a, 16b may have a slope Φ relative to vertical (i.e., relative to the y axis of the Cartesian coordinate system illustrated in FIG. 1A), where Φ may be in a range of 80 degrees to 90 degrees, for example. Thus, the trenches 16 may have a tapered or V-shaped profile (as shown in FIG. 1A), with a narrow bottom and a relatively wider top.

The trenches 16 may have critical dimensions 18 measured as narrowest lateral widths of the trenches 16 (e.g., as measured along the upper surface of the device layer 12b in a direction parallel to the x axis of the Cartesian coordinate system illustrated in FIG. 1A). The trenches 16 may also have tip-to-tip distances 20 measured between confronting longitudinal sidewalls 22a, 22b of longitudinally adjacent trenches 16 as shown in FIG. 1B. The critical dimensions 18 of the trenches 16 may be the same or may vary, and the tip-to-tip distances 20 between the trenches 16 may be the same or may vary. The present disclosure is not limited in this regard. In various, non-limiting embodiments, the trenches 16 may have critical dimensions 18 in a range of 5 nanometers to 20 nanometers and may have tip-to-tip distances attainable using conventional photolithography processes, e.g., in a range of 10 nanometers to 50 nanometers.

Figure 2A:
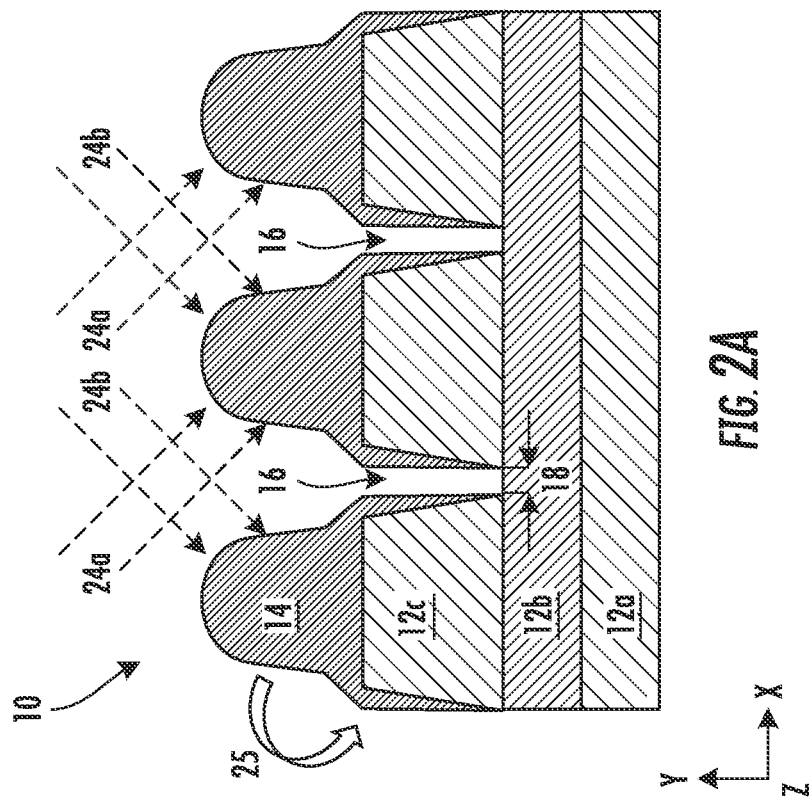

Referring to FIGS. 2A and 2B, a sputter etching process may be performed on the hardmask layer 14, wherein ion beams 24a, 24b formed of plasma ions may be directed toward the hardmask layer 14 in opposing lateral directions (i.e., in opposing directions along planes parallel to the x axis of the Cartesian coordinate system illustrated in FIG. 2B) and at oblique angles relative to the plane of the device layer 12a. The ion beams 24a, 24b may be directed in a highly controlled manner to etch the hardmask layer 14 and cause the etched material to be redistributed (via sputtering and gravity) along the lateral sidewalls 17a, 17b of the trenches 16, as indicated by the arrow 25 in FIG. 2A, in a manner making the lateral sidewalls 17a, 17b vertical or nearly vertical (e.g., with a slope Φ in a range of 0-5 degrees relative to vertical) while preserving the critical dimensions 18 of the trenches 16. Thus, after the sputter etching process is performed, the lateral sidewalls 17a, 17b may be generally perpendicular to the plane of the device layer 12a and generally parallel to the y axis of the Cartesian coordinate system illustrated in FIG. 2A.

Referring to FIGS. 3A and 3B, one or more ion etching processes (e.g., reactive-ion etching processes) may be performed on the trenches 16, wherein ion beams 26a, 26b formed of reactive plasma ions may be directed into the trenches 16 in opposing longitudinal directions (i.e., in opposing directions along planes parallel to the z axis of the Cartesian coordinate system illustrated in FIG. 3B) and may strike the longitudinal sidewalls 22a, 22b of the trenches 16. The ion beams 26a, 26b may etch the longitudinal sidewalls 22a, 22b, thus extending/elongating the trenches 16 longitudinally. Lengthening the trenches 16 thusly resultantly shortens the tip-to-tip distances 20 between the trenches 16 to a degree generally unattainable using conventional photolithography processes while avoiding the risk of tip-to-tip shorting between the trenches 16. In various non-limiting embodiments, the shortened tip-to-tip distances 20 may be in a range of 2 nanometers to 30 nanometers, for example.

Since the lateral sidewalls 17a, 17b of the trenches 16 were made vertical (or nearly vertical) prior to the etching/elongation process depicted in FIGS. 3A and 3B, the ion beams 26a, 26b employed in the etching process are oriented parallel to, and thus do not collide with, the lateral sidewalls 17a, 17b. Thus, the lateral sidewalls 17a, 17b are not etched by the ion beams 26a, 26b, and the critical dimensions 18 of the trenches 16 are preserved. This is to be contrasted with the sloped lateral sidewalls 17a, 17b of the trenches 16 shown in FIG. 1A, prior to being made vertical by way of the sputter etching process depicted in FIGS. 2A and 2B). Specifically, if the sloped lateral sidewalls 17a, 17b shown in FIG. 1A were subjected to the etching/elongation process depicted in FIGS. 3A and 3B, the ion beams 26a, 26b would strike and etch the sloped, laterally converging lateral sidewalls 17a, 17b, thus expanding the trenches 16 laterally and increasing the critical dimensions 18 of the trenches 16.

Figure 4B:
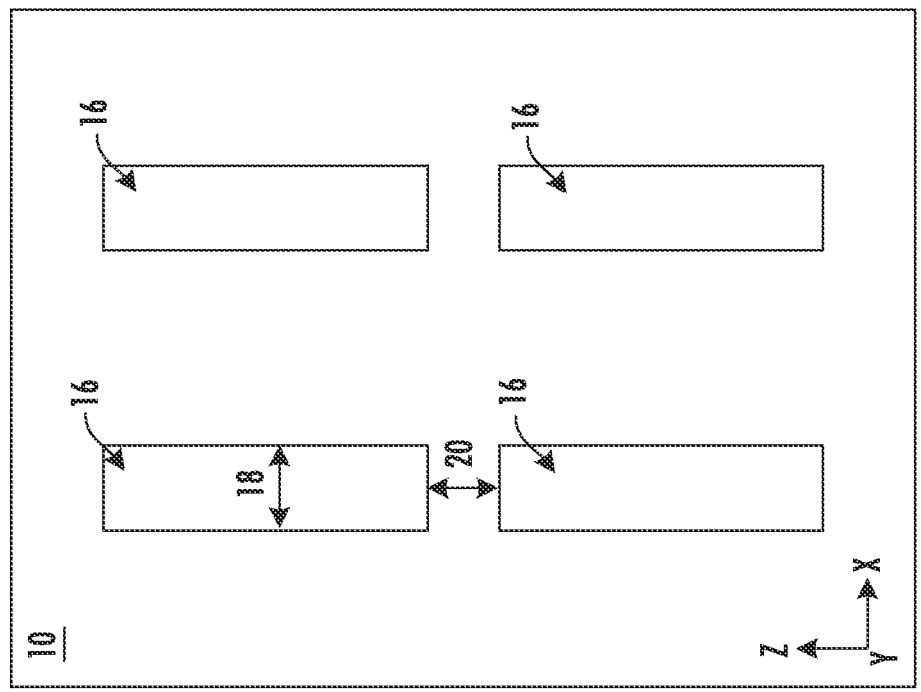
Figure 4A:
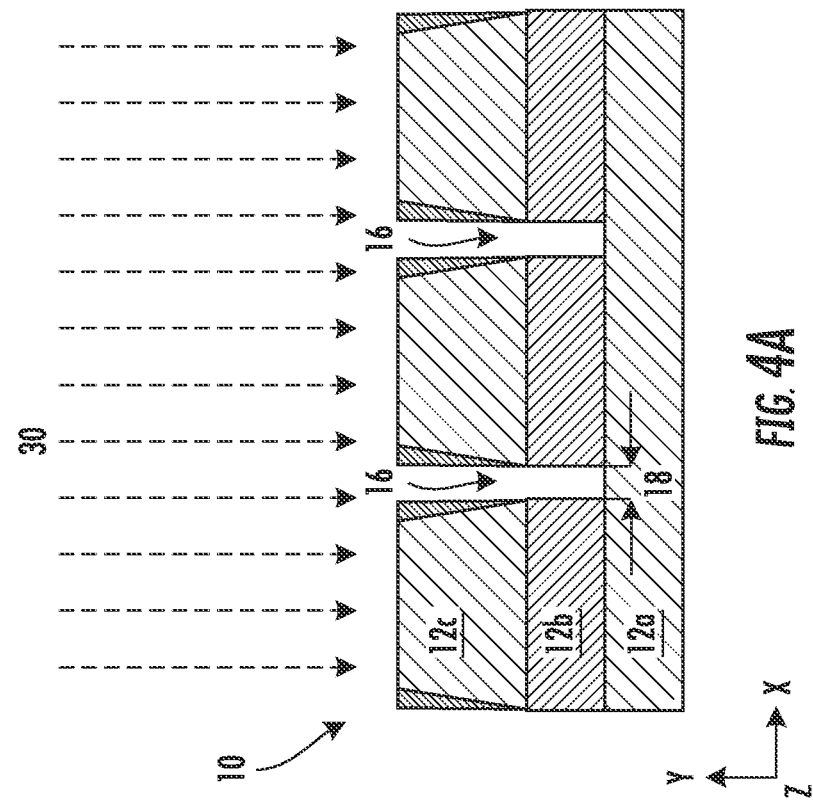

Referring to FIGS. 4A and 4B, a final ion etching process (e.g., a reactive-ion etching process) may be performed on the layer stack 10, wherein an ion beam 30 formed of reactive plasma ions may be directed into the trenches 16 at an angle perpendicular to the upper surface of the device layer 12b. The ion beam 30 may etch the device layer 12b and extend the trenches 16 partially or entirely through the device layer 12b. The trenches 16, originally defined by the device layer 12c and hardmask layer 14 (as shown in FIG. 1A), are thus transferred to the device layer 12b.

The above-described processes provide several advantages in the art. For example, the processes illustrated in FIGS. 1A-4B provide a relatively inexpensive and efficient method of forming surface features in a hardmask layer and in underlying device layers (e.g., semiconductor layers). Additionally, the processes may be performed in a manner facilitating small, nanometer-scale tip-to-tip distances generally attainable using conventional photolithography techniques while mitigating tip-to-tip shorting and critical dimension variation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method for patterning structures, comprising:
providing a layer stack including a plurality of device layers and a hardmask layer disposed in a stacked arrangement, the layer stack having a plurality of trenches formed therein, the trenches extending through the hardmask layer and into at least one of the device layers, the trenches having lateral sidewalls with a first slope relative to a plane perpendicular to upper surfaces of the device layers; and
performing a sputter etching process wherein ion beams are directed toward the hardmask layer to etch the hardmask layer and cause etched material from the hardmask layer to be redistributed along the lateral sidewalls of the trenches to provide the lateral sidewalls with a second slope relative to the plane perpendicular to the upper surfaces of the device layers, the second slope less than the first slope;
wherein, during the sputter etching process, the ion beams are directed toward the hardmask layer at oblique angles relative to the upper surfaces of the device layers.

2. The method of claim 1, further comprising performing an ion etching process wherein ion beams are directed toward longitudinal sidewalls of the trenches to elongate the trenches and reduce tip-to-tip distances between longitudinally adjacent trenches, and wherein critical dimensions of the trenches are preserved, the critical dimensions being lateral widths of the trenches measured along an upper surface of an uppermost of the device layers.

3. The method of claim 2 wherein, during the ion etching process, the ion beams are directed the into the trenches in opposing longitudinal directions.

4. The method of claim 2, wherein, during the ion etching process, the lateral sidewalls of the trenches are preserved or are minimally etched relative to the longitudinal sidewalls.

5. The method of claim 2, wherein the ion etching process reduces the tip-to-tip distances between longitudinally adjacent trenches to between 2 nanometers and 30 nanometers.

6. The method of claim 1, further comprising performing an ion etching process wherein ion beams are directed into the trenches at an angle perpendicular to the upper surfaces of the device layers to etch one or more of the device layers and thus extend the trenches into one or more of the device layers.

7. The method of claim 1, wherein the first slope is in a range of 80 degrees to 90 degrees and wherein the second slope is in a range of 0 degree to 5 degrees.

8. The method of claim 1, wherein at least one of the device layers is formed of one of silicon, germanium, silicon carbide, gallium arsenide, and gallium nitride.

9. The method of claim 1, wherein the hardmask is formed of at least one of silicon dioxide, silicon nitride, and amorphous carbon.

10. The method of claim 1, wherein, during the sputter etching process, the ion beams are directed toward the hardmask layer in opposing lateral directions.

11. A method for patterning structures, comprising:
providing a layer stack including a plurality of device layers and a hardmask layer disposed in a stacked arrangement, the layer stack having a plurality of trenches formed therein, the trenches extending through the hardmask layer and into at least one of the device layers, the trenches having lateral sidewalls with a first slope relative to a plane perpendicular to upper surfaces of the device layers;
performing a sputter etching process wherein ion beams are directed toward the hardmask layer to etch the hardmask layer and cause etched material from the hardmask layer to be redistributed along the lateral sidewalls of the trenches to provide the lateral sidewalls with a second slope relative to the plane perpendicular to the upper surfaces of the device layers, the second slope less than the first slope;
performing a first ion etching process wherein ion beams are directed toward longitudinal sidewalls of the trenches to elongate the trenches and reduce tip-to-tip distances between longitudinally adjacent trenches, and wherein critical dimensions of the trenches are preserved, the critical dimensions being lateral widths of the trenches measured along an upper surface of an uppermost of the device layers; and performing a second ion etching process wherein ion beams are directed to into the trenches at an angle perpendicular to the upper surfaces of the device layers to etch one or more of the device layers and thus extend the trenches into one or more of the device layers.

12. The method of claim 11, wherein the first ion etching process reduces the tip-to-tip distances between longitudinally adjacent trenches to between 2 nanometers and 30 nanometers.

13. The method of claim 11 wherein, during the first ion etching process, ion beams are directed into the trenches in opposing longitudinal directions.

14. The method of claim 11, wherein, during the first ion etching process, the lateral sidewalls of the trenches are preserved or are minimally etched relative to the longitudinal sidewalls.

15. The method of claim 11, wherein the first slope is in a range of 80 degrees to 90 degrees and wherein the second slope is in a range of 0 degree to 5 degrees.

16. The method of claim 11, wherein at least one of the device layers is formed of one of silicon, germanium, silicon carbide, gallium arsenide, and gallium nitride.

17. The method of claim 11, wherein the hardmask is formed of at least one of silicon dioxide, silicon nitride, and amorphous carbon.

18. The method of claim 11, wherein, during the sputter etching process, the ion beams are directed toward the hardmask layer in opposing lateral directions.

19. The method of claim 11, wherein, during the sputter etching process, the ion beams are directed toward the hardmask layer at oblique angles relative to the upper surfaces of the device layers.

\* \* \* \* \*